United States Patent
Davila

(10) Patent No.: US 9,494,631 B2
(45) Date of Patent: Nov. 15, 2016

(54) INTELLIGENT CURRENT ANALYSIS FOR RESONANT CONVERTERS

(71) Applicant: DET International Holding Limited, Grand Cayman (KY)

(72) Inventor: Marco Antonio Davila, Tucson, AZ (US)

(73) Assignee: DET International Holding Limited, Grand Cayman (KY)

( * ) Notice: Subject to any disclaimer, the term of this patent is extended or adjusted under 35 U.S.C. 154(b) by 106 days.

(21) Appl. No.: 13/887,352

(22) Filed: May 5, 2013

(65) Prior Publication Data

US 2013/0307559 A1 Nov. 21, 2013

Related U.S. Application Data

(60) Provisional application No. 61/642,816, filed on May 4, 2012.

(51) Int. Cl.
  *G01R 31/02* (2006.01)
  *G01R 27/26* (2006.01)
  (Continued)

(52) U.S. Cl.
  CPC ........ *G01R 27/2611* (2013.01); *H02M 3/3387* (2013.01); *H02J 7/025* (2013.01); *Y02B 70/1433* (2013.01)

(58) Field of Classification Search
  CPC ............ H02J 7/025; H02J 5/005; H02J 17/00; H04B 5/0037; H02M 2007/4815; H02M 3/3387; G01R 27/2611
  (Continued)

(56) References Cited

U.S. PATENT DOCUMENTS 1,876,451 A 9/1932 Telefunken
4,301,404 A 11/1981 Ley
(Continued)

FOREIGN PATENT DOCUMENTS

DE 10112892 A2 10/2002
EP 0507360 A2 10/1992
(Continued)

OTHER PUBLICATIONS

Half-Bridge LLC Resonant Converter Design Using FSFR-Series Fairchild Power Switch (FPSTM), Application Note AN-4151, 2007.*
(Continued)

*Primary Examiner* — Daniel Miller
(74) *Attorney, Agent, or Firm* — Vector IP Law Group; Robert S. Babayi

(57) ABSTRACT

A new method of extracting information from a current waveform for the purpose of controlling a resonant converter is presented. The method comprises the step of sampling the converter waveform exactly three times in half a period of the converter waveform or sampling the converter waveform exactly at three different positions in a sequence on different periods of the converter waveform and the step of extracting waveform information to produce a fundamental component and a triangular component of the converter waveform. The information could also be used for the purpose of predicting the inductance and load of a circuit to indicate alignment in a inductive charging system.

11 Claims, 5 Drawing Sheets

(51) Int. Cl.
*H02M 3/338* (2006.01)
*H02J 7/02* (2016.01)

(58) Field of Classification Search
USPC .......................................... 320/108; 324/537
See application file for complete search history.

(56) References Cited

U.S. PATENT DOCUMENTS

| | | | |
|---|---|---|---|
| 5,850,135 A * | 12/1998 | Kuki et al. .................... | 320/108 |
| 2004/0119576 A1 | 6/2004 | Nakao | |
| 2004/0232845 A1 | 11/2004 | Baarman | |
| 2005/0140482 A1 | 6/2005 | Cheng | |
| 2008/0218153 A1 * | 9/2008 | Patel et al. ................. | 324/76.21 |
| 2009/0001932 A1 * | 1/2009 | Kamijo .................. | H02J 5/005 |
| | | | 320/108 |
| 2010/0308939 A1 | 12/2010 | Kurs | |
| 2011/0193416 A1 * | 8/2011 | Campanella ............ | H01Q 7/00 |
| | | | 307/104 |
| 2013/0039099 A1 * | 2/2013 | Wu et al. ....................... | 363/40 |

FOREIGN PATENT DOCUMENTS

| | | |
|---|---|---|
| EP | 1011187 A1 | 6/2000 |
| EP | 1634366 A1 | 3/2006 |
| EP | 2172952 A1 | 4/2010 |
| EP | 2196351 A1 | 6/2010 |
| GB | 2458476 A | 9/2009 |
| JP | 2001076598 A | 3/2001 |
| JP | 2009123727 A | 6/2009 |
| JP | 2011142177 A | 7/2011 |
| WO | 9948130 A1 | 9/1999 |
| WO | 0116995 A1 | 3/2001 |
| WO | 2008140333 A2 | 11/2008 |
| WO | 2009111597 A2 | 9/2009 |
| WO | 2010/090538 A1 | 8/2010 |
| WO | 2010090538 A1 | 8/2010 |
| WO | 2010090539 A1 | 8/2010 |
| WO | 2011148289 A2 | 12/2011 |
| WO | 2012008693 A2 | 1/2012 |
| WO | 2012/018268 A1 | 2/2012 |
| WO | 2012018268 A1 | 2/2012 |

OTHER PUBLICATIONS

Discrete Fourier Transform, available at http://en.wikipedia.org/wiki/Discrete_Fourier_transform on May 30, 2010.*
European Patent Office Search Report, Mar. 23, 2015, 10 pages, Application No. EP 13405056.6.
European Patent Office Search Report, Jun. 23, 2014, 8 pages, Application No. EP 13405055.8.
European Patent Office Search Report, Feb. 11, 2015, Application No. EP 13405054.1.
European Patent Office Search Report, Jan. 13, 2014, Application No. EP 13405057.4.
Fotopoulou K et al., "Wireless Powering of Implanted Sensors using RF Inductive Coupling",Sensors, 2006. 5th IEEE Conference on, IEEE, PI, Oct. 22, 2006, pp. 765-768.
Phadke A G et al., "A New Measurement Technique for Tracking Voltage Phasors, Local System Frequency, and Rate of Change of Frequency", IEEE Transactions on Power Apparatus and Systems, IEEE Inc. New York, US, vol. PAS-100, No. 5, May 1, 1983, pp. 1025-103.
Budhia M et al: "A new IPT magnetic coupler for electric vehicle charging systems", IECON 2010—36th Annual Conference on IEEE Industrial Electronics Society, IEEE, Nov. 7, 2010, pp. 2487-2492, NJ, USA.
Masato Chigira et al: "Small-size light-weight transformer with new core structure for contactless electric vehicle power transfer system", Energy Conversion Congress and Exposition (ECCE), 2011 IEEE, IEEE, Sep. 17, 2011, pp. 260-266.
European Patent Office Communication Pursuant to Article 94(3) EPC, Jul. 9, 2015, Application No. 13 405 058.2.

* cited by examiner

Prior Art

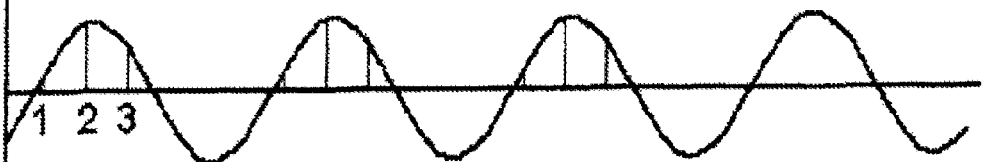
Figure 2A — Samples Taken at 1/6, 1/3, and 1/2 the period
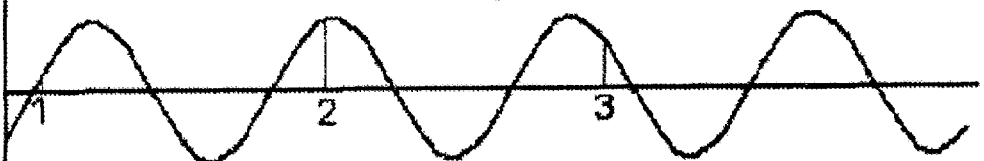
Figure 2B — Samples Taken at 1/6, 1 1/3, and 2 1/2 the period

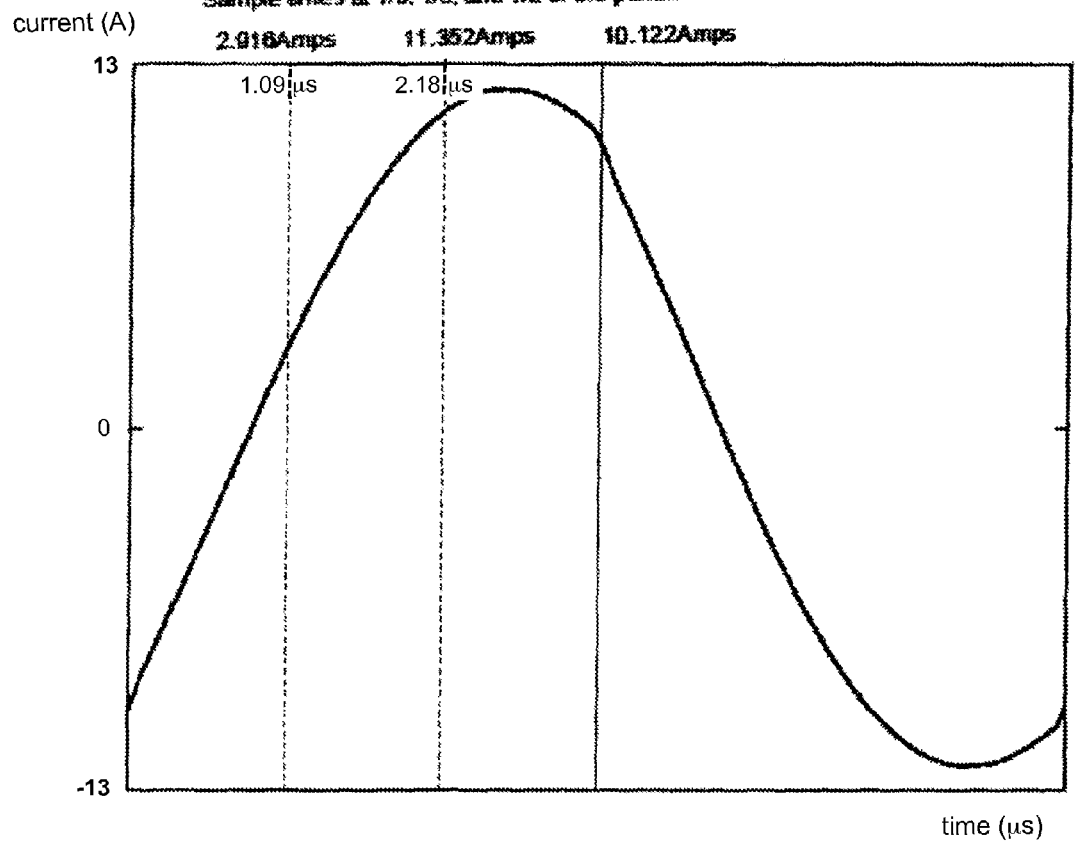

Itriangle = 3 * Isample1 − 3 * Isample2 + 3 * Isample3      Itriangle = 5.058

Icos = Itriangle − Isample3      Icos = −5.064

$$Icos = \frac{Isample1 + Isample2}{\sqrt{3}}$$      Isin = 8.23763

INTELLIGENT CURRENT ANALYSIS FOR RESONANT CONVERTERS

RELATED APPLICATION/CLAIM OF PRIORITY

This application is related to and claims priority from U.S. Provisional application Ser. No. 61/642,816, entitled Intelligent Current Analysis for Resonant Converters filed May 4, 2012, which provisional application is incorporated herein by reference.

INTRODUCTION

Resonant converters have grown in popularity in recent years, including the use of the popular LLC converter. Resonant converters have operating conditions that can produce zero voltage switching in the switches in the primary but in other conditions might produce incorrect current wave shapes that could stress and potentially damage the switches. In other conditions the operating frequency might be safe for the switches but it could have a reverse loop gain compared to the normal zones. This occurs when going past resonance in either direction.

Recently, inductive chargers (wireless converters) use resonant structures to process power due to the large leakage inductance. This leakage inductance changes with distance and alignment which produces a need to change the safe operating zone of the converter. Analysis of the current waveform has become more important for these types of converters.

What is presented in this application is an innovative analysis method applied to the current waveform that will extract the needed information to keep the converter in the correct switching conditions.

The principles of the present invention are described further below with reference to the accompanying drawings.

PRIOR ART AND OBJECTIVES OF THE PRESENT INVENTION

Traditionally the safe operating zone of a resonant converter is calculated and limits are placed on the operating frequency of the converter. Since the leakage inductance was a known and designed quantity this method has proven to be reliable. Load changes can change the safe operating zones and typically over limiting the frequency can prevent the converter from crossing over to unsafe operating zones. This comes with a penalty of restricting the converter to a narrower operating range which can impact efficiency.

In wireless converters this problem is further increased by having the leakage inductance as a variable parameter. The leakage inductance of a wireless power system is dependent on alignment and gap distance. This variation of inductance can be a major problem in finding the safe operating zone.

It is the purpose of this invention to introduce a new method to analyze the primary current waveform to determine whether the converter is nearing an unsafe zone and in addition determine the reactive and resistive current. By analyzing the current, according to the present invention, the correct frequency range can be determined dynamically.

The Attached Drawings, FIGS. 1-5 are described below in the context of this invention

BRIEF DESCRIPTION OF THE DRAWINGS

FIG. 2A is a waveform diagram showing samples taken at shown periods.
FIG. 2B is another waveform diagram showing samples taken at shown periods.
FIG. 3 is a current waveform of a LLC converter with extracted samples and values at the indicated times.

FURTHER DESCRIPTION OF THE PRESENT INVENTION

Three Point Measurement

Figure 1:
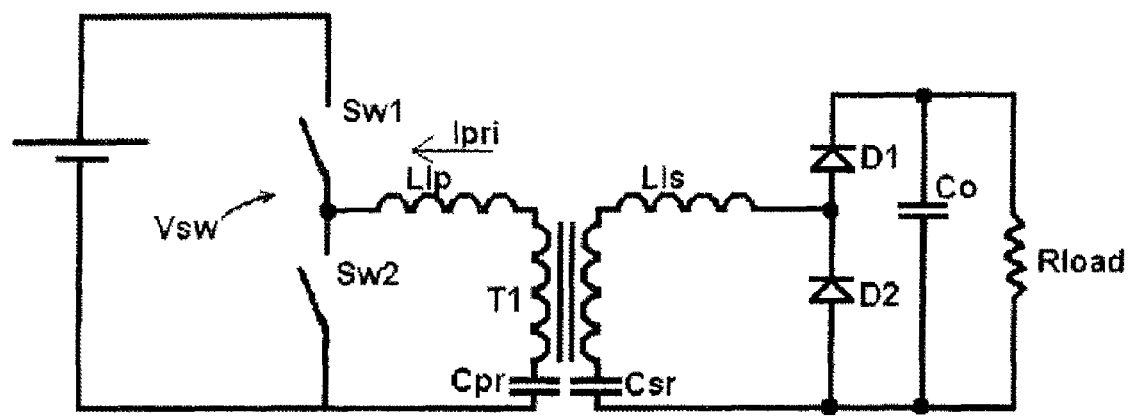
FIG. 1 is an image of a prior art typical resonant converter.

The typical resonant converter is comprised of a half bridge configuration with tuned capacitors in the primary to resonate with a parasitic or designed leakage inductance in the primary (FIG. 1). The secondary may also have tuned capacitors. A square wave voltage is applied to the structure by switching the switches at operating frequency with an ideal 50% duty cycle.

This voltage square wave produces through the inductance/capacitor network a current waveform that to the first approximation is a sinusoidal signal superimposed with a triangular signal (see FIGS. 2A and 2B for shape). The triangular signal is equal to the signal that would have been produced if the capacitors in the network were ideal and large, so its amplitude is dependent only on the inductance of the circuit. Another way to analyze this is that if the converter inductances and capacitances are resonating at the switching frequency then at higher order harmonics, the capacitors' impedances are much smaller than the impedance of the inductance of the circuit. These higher order harmonic currents are more heavily dependent on the inductance of the circuit. Therefore, the square wave that is injected can be thought of two separate waveforms. One is the sine wave component that is affected by the inductance and capacitance of the circuit and another that is all higher order harmonics that define the original square wave that is affected by only the inductance of the circuit.

At resonance the sine wave component starts at zero and ends at 180 degrees. But typically the converter does not run at resonance. It will run either above or below resonance depending on the designed operating zone(s). In these cases the sine wave component will have a phase shift relative to the original square wave. This phase shift can be represented by an angle or can alternatively be represented by a sine wave component plus a cosine component both in phase with the square wave. Both components are very useful to use. The sine wave portion is proportional to power delivered to the secondary. The cosine component is the reactive component which is an indicator for the amount below or above resonance.

Since the triangular component is highly dependent on the inductance of the circuit it is useful to be able to analyze if the inductance of the system is within the operating parameters. In this way, a wireless charger can determine that the secondary is too far away to even start to produce power.

Since it is advantageous to have all three components to analyze the current wave shape (sine, cosine, and triangular components), a method is needed that will extract these components. By Fourier analysis, the triangular component is composed at least of the fundamental and the $3^{rd}$ harmonic component. Since the sine and cosine also contain the fundamental we must have a method to eliminate the $3^{rd}$ harmonic from those readings. Once we know how much $3^{rd}$ harmonic component there is we can subtract out the triangular portion from the original reading. Using Nyquist theory, in order to identify the $3^{rd}$ harmonic component we must make 6 samples during one period. This is accomplished by taking 3 samples during one half the period of the conduction of one of the switches. The assumption is that the other half is identical just opposite polarity. The optimum times to take the samples was discovered in the first embodiment to be at $\frac{1}{6}$, $\frac{2}{6}$, $\frac{3}{6}$ of the period.

The samples could be taken in a single period or if the ADC is not fast enough one sample can be taken one at a time just the position of the next sample can be rotated. For example, lets say that period is 1 unit long, then sample 1 is taken at $\frac{1}{6}$, sample 2 at $1\frac{1}{3}$, and sample 3 taken at $2\frac{1}{2}$. (see FIGS. 2a and 2b). If the ADC is even slower then more periods can be placed between samples. As long as the frequency is not changing between samples the data should not be affected.

Once the 3 samples are taken the components were extracted by using the following ratios:

Itriangle=3*Sample1−3*Sample2+3*Sample3, where Itriangle is peak of the triangular current.

Icos=3*Sample1−3*Sample2+2*Sample3, where Icos is amplitude of the cosine component.

Isin=Sample1/sqrt(3)+Sample2/sqrt(3), where Isin is the amplitude of the sine component.

These ratios can be changed depending on the sample positions or delays.

Figures 4, 5:
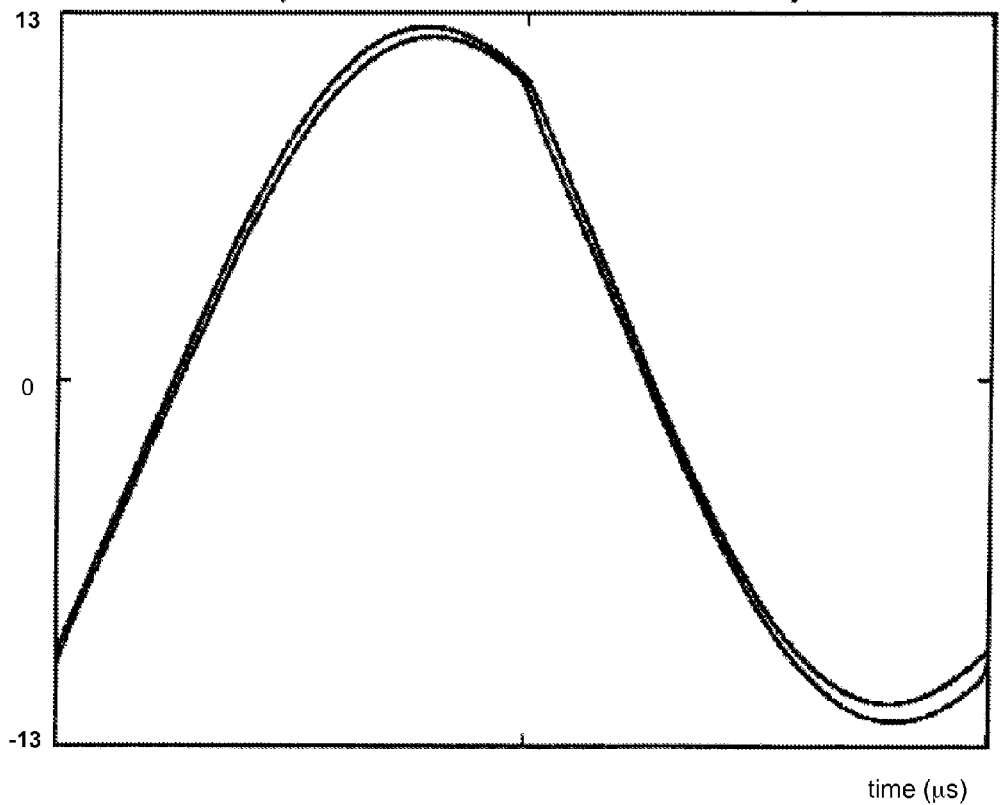
FIG. 4 shows the calculated values for the components
FIG. 5 shows the reconstructed current waveform using these components in comparison to the original waveform.
Figure 6:
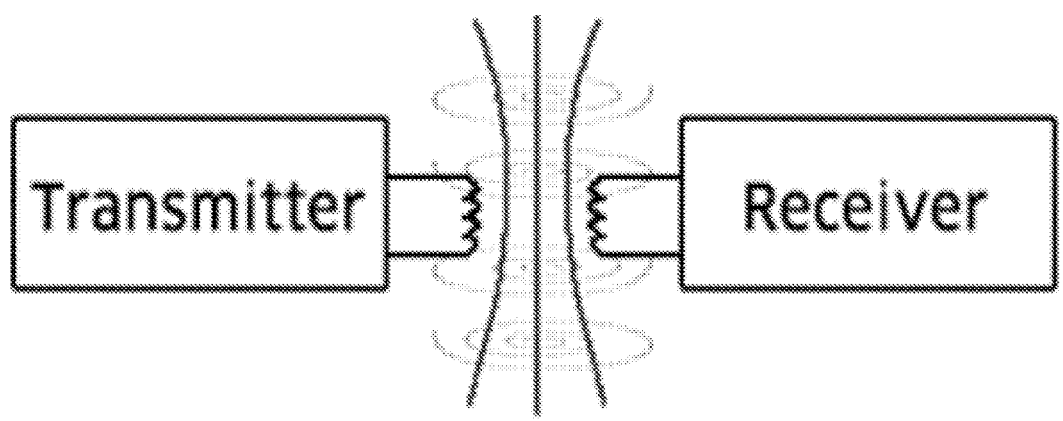
FIG. 6 shows a block diagram of a wireless charging system that incorporates the present invention, including wireless transmitter and receiver charging coils.

FIG. 3 is a current waveform of a LLC converter with extracted samples and values at the indicated times. FIG. 4 shows the calculated values for the components. And FIG. 5 shows the reconstructed current waveform using these components in comparison to the original waveform.

The invention claimed is:

1. A method of acquiring and analyzing a converter waveform of a half-bridge converter having a switching frequency range, comprising sampling the converter waveform at an output of the half-bridge converter exactly 3 times in half a period of the converter waveform or sampling the converter waveform exactly at 3 different positions in a sequence on different periods of the converter waveform and extracting current information of the waveform to produce a fundamental component and a triangular component of the converter waveform, wherein the extracted current information is used to determine a reactive current and a resistive current in the half-bridge converter, and wherein the switching frequency range of the half-bridge converter is controlled dynamically based on the determined reactive and resistive currents.

2. The method of claim 1, including the step of extracting a phase information from the fundamental component.

3. The method of claim 1, including the step of using the extracted current information of the waveform to predict load and inductance information about a circuit.

4. The method of claim 3, including the step of using the extracted current information of the waveform to provide an indication of alignment of a magnetic circuit in a wireless inductive charging system.

5. The method according to claim 1, including determining a safety zone of frequencies.

6. The method according to claim 1, including the step of analyzing the converter waveform of the half-bridge converter.

7. The method according to claim 6 including the steps of determining an inductance of the half-bridge converter and analyzing if the inductance of the system is within operating parameters.

8. The method according to any of the claim 6, including the step of determining the power delivery from a primary circuit of the resonant converter to a secondary circuit of the resonant converter.

9. The method according to claim 4, including the step of determining if a secondary circuit of the converter is unable to produce power in the wireless inductive charging system.

10. A Half-bridge Converter configured to perform any of the methods according to claim 1.

11. Wireless inductive charging system including a converter according to claim 1.

* * * * *